(12) United States Patent
Hoshino et al.

(10) Patent No.: US 12,281,410 B2
(45) Date of Patent: Apr. 22, 2025

(54) METHOD AND APPARATUS FOR MANUFACTURING SILICON CARBIDE SINGLE CRYSTAL, AND SILICON CARBIDE SINGLE CRYSTAL INGOT

(71) Applicants: CENTRAL RESEARCH INSTITUTE OF ELECTRIC POWER INDUSTRY, Tokyo (JP); DENSO CORPORATION, Kariya (JP)

(72) Inventors: Norihiro Hoshino, Yokosuka (JP); Isaho Kamata, Yokosuka (JP); Hidekazu Tsuchida, Yokosuka (JP); Takahiro Kanda, Kariya (JP); Takeshi Okamoto, Kariya (JP)

(73) Assignees: CENTRAL RESEARCH INSTITUTE OF ELECTRIC POWER INDUSTRY, Tokyo (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 17/498,964

(22) Filed: Oct. 12, 2021

(65) Prior Publication Data

US 2022/0112623 A1  Apr. 14, 2022

(30) Foreign Application Priority Data

Oct. 13, 2020  (JP) .................. 2020-172489

(51) Int. Cl.
*C30B 29/36* (2006.01)
*C01B 32/956* (2017.01)
(Continued)

(52) U.S. Cl.
CPC ............ *C30B 29/36* (2013.01); *C01B 32/956* (2017.08); *C30B 23/02* (2013.01); *C30B 35/00* (2013.01); *H01L 29/30* (2013.01)

(58) Field of Classification Search
None
See application file for complete search history.

(56) References Cited

U.S. PATENT DOCUMENTS

2014/0363607 A1* 12/2014 Sato .................. C30B 23/02
428/64.1
2018/0066380 A1  3/2018 Tani

FOREIGN PATENT DOCUMENTS

JP  2000-053498 A  2/2000
JP  2006-1836  1/2006
(Continued)

OTHER PUBLICATIONS

Fujimoto et al. JP2006290705A; translation provided by Google Patents Jun. 20, 2024.*

(Continued)

*Primary Examiner* — Guinever S Gregorio
(74) *Attorney, Agent, or Firm* — NIXON & VANDERHYE

(57) ABSTRACT

A method and an apparatus for manufacturing a silicon carbide single crystal, and a silicon carbide single crystal ingot, obtaining a silicon carbide single crystal reduced in defects such as threading dislocations, are provided. The method manufactures a silicon carbide single crystal by supplying a raw material gas into a reaction vessel with a seed substrate, and heats the interior to grow a silicon carbide single crystal on the surface of the seed substrate. The method includes growing the silicon carbide single crystal on the seed substrate surface, while controlling the temperature, to perform pair annihilation of threading dislocations or synthesis of the threading dislocations; and a second step of maintaining the temperature inside the reaction vessel in the state of the first predetermined temperature after execution of the first step, to bring the leading ends of (Continued)

the threading dislocations close to the surface of the seed substrate.

1 Claim, 2 Drawing Sheets

(51) Int. Cl.
*C30B 23/02* (2006.01)
*C30B 35/00* (2006.01)
*H01L 29/30* (2006.01)

(56) References Cited

FOREIGN PATENT DOCUMENTS

| | | |
|---|---|---|
| JP | 2006-193384 A | 7/2006 |
| JP | 2006290705 A | 10/2006 |
| JP | 2011219296 A | 11/2011 |
| WO | 2016133172 A1 | 8/2016 |

OTHER PUBLICATIONS

Office Action issued in Chinese Patent Application No. 202111193447.1 dated May 11, 2023.
Office Action, issued in Japanese Patent Application No. 2020-172489 dated Dec. 13, 2023.

* cited by examiner

METHOD AND APPARATUS FOR MANUFACTURING SILICON CARBIDE SINGLE CRYSTAL, AND SILICON CARBIDE SINGLE CRYSTAL INGOT

The entire disclosure of Japanese Patent Application No. 2020-172489 filed on Oct. 13, 2020 is expressly incorporated by reference herein.

TECHNICAL FIELD

This invention relates to a method and an apparatus for manufacturing a silicon carbide single crystal, and a silicon carbide single crystal ingot.

BACKGROUND ART

Silicon carbide (may hereinafter be referred to as SiC) is a semiconductor exhibiting excellent physical property values—a bandgap about 3 times as wide as, a saturation drift velocity about 2 times as high as, and a dielectric breakdown field strength about 10 times as high as, those of Si—and having a great thermal conductivity. Thus, it is expected as a material which realizes a next generation high voltage, low loss semiconductor device delivering performance markedly surpassing the performance of the Si single crystal semiconductor currently in use.

Among methods for manufacturing SiC single crystals is a manufacturing method, called the HTCVD method, which uses an Si-containing gas such as $SiH_4$, and a C-containing gas such as $C_3H_8$ or $C_2H_2$, as raw materials to obtain a new SiC single crystal on a seed substrate.

In order to realize a high performance semiconductor device, there is need to minimize defects such as threading dislocations (threading screw dislocations, threading edge dislocations) generated in the SiC single crystal. To decrease such threading dislocations, various technologies have been proposed for growing a crystal, with a surface at a predetermined offset angle with respect to a basal plane being used as a growth plane (e.g. Patent Literature 1).

For the manufacture of the SiC single crystal, technologies for reducing defects such as threading dislocations (threading screw dislocations, threading edge dislocations) have been proposed. Further reduction of the defects is under consideration, but there leaves room to reduce defects such as threading dislocations.

PRIOR ART LITERATURES

Patent Literatures

Patent Literature 1: JP 2006-1836 A

SUMMARY OF INVENTION

Problems to be Solved by the Invention

The present invention has been accomplished in the light of the above-described circumstances. It is an object of this invention to provide a method and an apparatus for manufacturing a silicon carbide single crystal, and a silicon carbide single crystal ingot, the method, apparatus and ingot being capable of obtaining a silicon carbide single crystal decreased in defects such as threading dislocations.

To attain the above object, the present inventors conducted in-depth studies, and have found that the leading ends of the threading dislocations can be brought close to the surface of the seed substrate by performing predetermined heat treatment after crystal growth. This finding has led them to accomplish the present invention.

Means for Solving the Problems

A first aspect of the present invention for attaining the above object is a method for manufacturing a silicon carbide single crystal by supplying a raw material gas to the interior of a reaction vessel, in which a seed substrate is disposed, and heating the interior of the reaction vessel to a predetermined temperature, thereby growing a silicon carbide single crystal on the surface of the seed substrate, the method comprising a first step of growing the silicon carbide single crystal on the surface of the seed substrate, while controlling the temperature inside the reaction vessel to the state of a first predetermined temperature, to perform pair annihilation of threading dislocations or synthesis of the threading dislocations; and a second step of maintaining the temperature inside the reaction vessel in the state of the first predetermined temperature after execution of the first step, to bring the leading ends of the threading dislocations close to the surface of the seed substrate.

As noted above, in the first step, a silicon carbide single crystal is grown on the surface of the seed substrate, with the temperature inside the reaction vessel being controlled to the state of the first predetermined temperature, whereby pair annihilation of threading dislocations or synthesis of the threading dislocations is performed. In the second step, after the first step, the temperature inside the reaction vessel is maintained in the state of the first predetermined temperature, and the supply of the raw material intended for a higher purpose than correcting sublimation or etching with a hydrogen gas or the like is performed. By so doing, the vertically upper end positions of the threading dislocations can be brought close to the surface of the seed substrate.

A second aspect of the present invention is the method for manufacturing a silicon carbide single crystal according to the first aspect, wherein the second step is performed such that the growth rate of the silicon carbide single crystal or the etching rate is 0.1 mm/h or less.

According to this feature, since the growth rate of the silicon carbide single crystal or the etching rate is 0.1 mm/h or less, heating can be performed, without a marked change in the thickness of the silicon carbide single crystal.

A third aspect of the present invention is the method for manufacturing a silicon carbide single crystal according to the first or second aspect, wherein the first predetermined temperature is in the range of 2400° C. to 2550° C., and the temperature difference in the diametrical direction of the silicon carbide single crystal is 10° C. or less.

As noted above, the first predetermined temperature is set at 2400° C. to 2550° C., whereby the movement of the threading dislocations can be made to occur easily. By setting the temperature difference in the diametrical direction of the silicon carbide single crystal to be 10° C. or less, moreover, thermal stress on the silicon carbide single crystal can be rendered as low as possible.

A fourth aspect of the present invention is the method for manufacturing a silicon carbide single crystal according to any one of the first to third aspects, wherein an $SiH_4$ gas partial pressure in the first step is 7.0 kPa or higher and a $C_3H_8$ gas partial pressure in the first step is 1.5 kPa or higher, while an $SiH_4$ gas partial pressure in the second step is 2.0 kPa or higher and a $C_3H_8$ gas partial pressure in the second step is 0.5 kPa or higher.

A fifth aspect of the present invention is the method for manufacturing a silicon carbide single crystal according to any one of the first to fourth aspects, wherein the silicon carbide single crystal having a threading dislocation density decreased by the second step is used as the seed substrate for growth of the silicon carbide single crystal.

A sixth aspect of the present invention is an apparatus for manufacturing a silicon carbide single crystal by performing the method for manufacturing a silicon carbide single crystal according to any one of the first to fifth aspects, further comprising a device which has the functions of detecting gas flow rates and temperatures in the first step and the second step, and at least controlling the gas flow rates and the temperatures, and which controls the gas flow rates and the temperatures in accordance with recipes stored in memory.

Effects of the Invention

According to the present invention, there are provided a method and an apparatus for manufacturing a silicon carbide single crystal, and a silicon carbide single crystal ingot, in which the leading ends of the threading dislocations can be brought close to the surface of the seed substrate, so that defects such as threading dislocations can be reduced, by the execution of predetermined heat treatment after crystal growth.

MODE FOR CARRYING OUT INVENTION

The present invention will now be described based on its embodiments.

Embodiment 1

The present invention concerns a method for manufacturing a silicon carbide single crystal by supplying a raw material gas to the interior of a reaction vessel, in which a seed substrate is disposed, and heating the interior of the reaction vessel to a predetermined temperature, thereby growing a silicon carbide single crystal on the surface of the seed substrate. The method comprises a first step of growing the silicon carbide single crystal on the surface of the seed substrate, while controlling the temperature inside the reaction vessel to the state of a first predetermined temperature, to perform pair annihilation of threading dislocations or synthesis of the threading dislocations; and a second step of maintaining the temperature inside the reaction vessel in the state of the first predetermined temperature after execution of the first step, to bring the leading ends of the threading dislocations close to the surface of the seed substrate.

Figure 1:
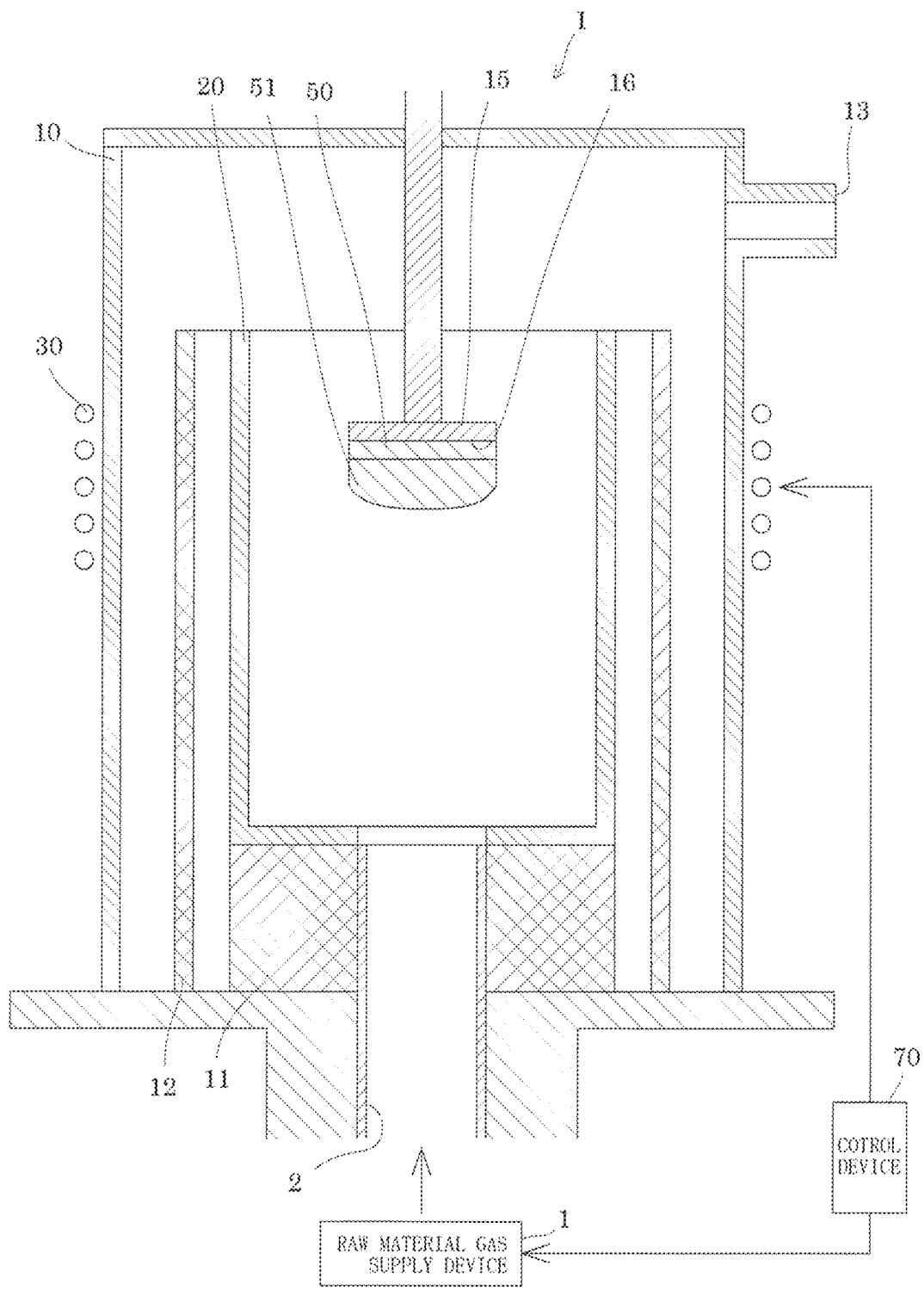
FIG. 1 is a sectional view of a manufacturing apparatus for manufacturing a silicon carbide single crystal according to an embodiment of the present invention.

First, an example of an apparatus for manufacturing a silicon carbide (SiC) single crystal wafer will be described. FIG. 1 is a schematic sectional view of the manufacturing apparatus.

A manufacturing apparatus I bulk-grows an SiC single crystal by a high temperature gas growth method. The manufacturing apparatus I has a reaction vessel 20 housed within a vacuum container 10. A raw material gas supply device 1 for supplying a raw material gas is connected to the manufacturing apparatus I.

The raw material gas supply device 1 is a device for supplying the raw material gas to the reaction vessel 20. The raw material gas has a composition for growing SiC. An example usable as the raw material gas is a mixture of various gases, such as $SiH_4$ as an Si-based reactive species, $C_3H_8$ as a carbon-based reactive species, and $H_2$ or Ar as a carrier gas.

The vacuum container 10 is a container for accommodating the reaction vessel 20 inside, and its interior can be controlled to a pressure ranging from vacuum to atmospheric pressure. The vacuum container 10 of the present embodiment is formed in a cylindrical shape, and has a bottom surface open so that piping 2 can be inserted through it. The vacuum container 10 is provided with an exhaust path 13 for communication between the inside and the outside. The material for the vacuum container 10 is not limited, but quartz or a metal, for example, can be used as the material.

The reaction vessel 20 is a container in which a seed substrate 50 composed of SiC is housed inside and supplied with the raw material gas to grow an SiC single crystal. Concretely, the reaction vessel 20 is formed in a cylindrical shape open at its top surface and its bottom surface, and the piping 2 is connected to an opening formed in the bottom surface. A susceptor 15, a pedestal, is installed from the opening side of the top surface so as to be situated inside the reaction vessel 20.

The reaction vessel 20 is formed, for example, from a heat insulating material. The heat insulating material is not particularly limited, but may, for example, be a high melting point metal such as tantalum (Ta), niobium (Nb), zirconium (Zr), titanium (Ti) or tungsten (W), or a carbide of any of them, or graphite.

The susceptor 15 is an instrument for holding the seed substrate 50 composed of SiC. Concretely, the susceptor 15 has a holding surface 16 facing downward in the drawing. The seed substrate 50 is attached to the holding surface 16.

The raw material gas supply device 1 for supplying the raw material gas is connected to the piping 2 provided at the middle of a lower part of the reaction vessel 20. The raw material gas from the raw material gas supply device 1 is supplied to the internal space of the reaction vessel 20, and supplied to the growth surface which is the undersurface of the seed substrate 50.

Various gas supply means for supplying the raw material gas to the growth surface of the seed substrate 50 uniformly in the planar direction and at a high speed may be provided within the reaction vessel 20.

Inside the vacuum container 10, a first heat insulating material 11 and a second heat insulating material 12 are arranged. Concretely, the first heat insulating material 11 is configured to cover an outer peripheral portion of the piping 2 appearing within the vacuum container 10. The second heat insulating material 12 is configured in a tubular form so as to accommodate the reaction vessel 20 inside. The materials for these heat insulating materials are not particularly limited, but alumina, zirconia, pyrolytic carbon, graphite, or carbon felt, for example, is available.

The first heat insulating material 11 maintains the temperature of the raw material gas inside the piping 2, while the second heat insulating material 12 maintains the temperature inside the reaction vessel 20.

Outside the vacuum container 10 is arranged a coil 30 as an example of a temperature control means for setting the temperature inside the reaction vessel 20.

The coil 30 performs induction heating of the reaction vessel 20. Although not illustrated, the coil 30 is connected to an alternating current power supply, and supplied with a high frequency alternating current. The coil 30 can bring the temperature inside the reaction vessel 20 to a temperature suitable for the growth of the SiC single crystal, e.g. a high temperature of 1500° C. or above. If the vacuum container 10 made of a metal is used, the coil 30 is arranged inside the vacuum container 10, but outside the reaction vessel 20.

Although not illustrated, the susceptor 15 is equipped with a heat dissipation mechanism, and can dissipate heat from the seed substrate 50 to render its temperature relatively lower than the temperature of the raw material gas.

In the SiC single crystal manufacturing apparatus I of the above-described configuration, the interior of the reaction vessel 20 is set at a high temperature by the coil 30. On the other hand, the seed substrate 50 is set at a relatively low temperature by the heat dissipation mechanism of the susceptor 15.

The raw material gas is delivered from the raw material gas supply device 1, passed through the piping 2, and supplied to the seed substrate 50 held by the susceptor 15 inside the reaction vessel 20 to grow an SiC single crystal. Then, the raw material gas is exhausted to the outside through the opening in the upper surface of the reaction vessel 20 via the exhaust path 13 of the vacuum container 10.

With the manufacturing apparatus I, the raw material gas is supplied to the seed substrate 50, whereby the SiC single crystal is grown on the seed substrate 50. According to the present invention, there are performed the first step of growing the silicon carbide single crystal on the surface of the seed substrate 50, while controlling the temperature inside the reaction vessel 20 to the state of the first predetermined temperature, to carry out pair annihilation of threading dislocations or synthesis of threading dislocations; and the second step of maintaining the temperature inside the reaction vessel in the state of the first predetermined temperature after execution of the first step, to bring the leading ends of the threading dislocations close to the surface of the seed substrate.

In performing the first step and the second step, the temperature and the gas flow rate inside the reaction vessel 20 need to be controlled to predetermined values in the first and second steps. Such control is exercised by a control device 70. For this control over the temperature and the gas volume, a detection device (not shown) is provided for detecting a temperature and gas partial pressures within the reaction vessel 20, particularly in the vicinity of the growth surface of the seed substrate 50. Based on the detection values of the detection device, the control device 70 controls the gas flow rate and temperature in accordance with pre-stored recipes.

In the first step, a predetermined flow rate of the raw material gas for growing a single crystal of silicon carbide on the seed substrate is supplied in the state of the first predetermined temperature. As these conditions for the first step, conditions sufficient for silicon carbide single crystal growth are not problematical, but because of productivity, it is preferred to set conditions under which the single crystal can be grown at as high a growth rate as possible.

In such a first step, it is desirable that the first predetermined temperature be in the range of 2400° C. to 2550° C., and that the temperature difference in the planar direction of the growth surface of the silicon carbide single crystal be 10° C. or less, preferably 5° C. or less.

The first step supplies the raw material gas, which can be exemplified by a hydrogen gas, a monosilane, or a hydrocarbon gas. Concretely, as stated earlier, a mixture of various gases, such as $SiH_4$ as an Si-based reactive species, $C_3H_8$ as a carbon-based reactive species, and $H_2$ or Ar as a carrier gas, can be used as the raw material gas.

In the raw material gas, desirably, the partial pressure of the $SiH_4$ gas is 7.0 kPa or higher, and the partial pressure of the $C_3H_8$ gas is 1.5 kPa or higher.

The duration of the first step is not particularly limited, and the first step can be continued as long as there is a space where a grown silicon carbide single crystal 51 can grow further.

In the first step described above, the silicon carbide single crystal grows on the growth surface of the seed substrate at a predetermined rate of 1 mm/h or more, resulting in the formation of the silicon carbide single crystal 51. Even if conditions generating as few defects as possible are set, however, threading dislocations are formed.

The threading dislocations include threading screw dislocations and threading edge dislocations. They are formed so as to penetrate along the direction of growth of the silicon carbide single crystal 51.

Figure 2A:
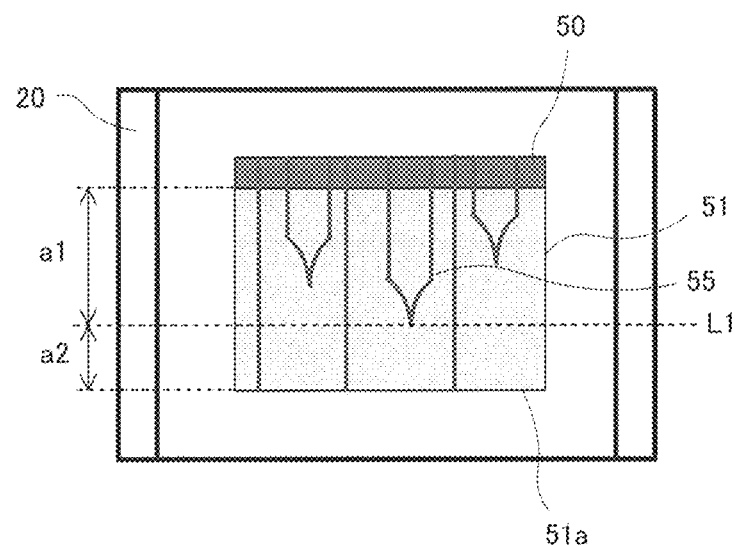
FIG. 2A and FIG. 2B are views schematically showing longitudinal sections of a silicon carbide single crystal after a first step and a second step of a manufacturing process for the silicon carbide single crystal according to the present embodiment.
Figure 2B:
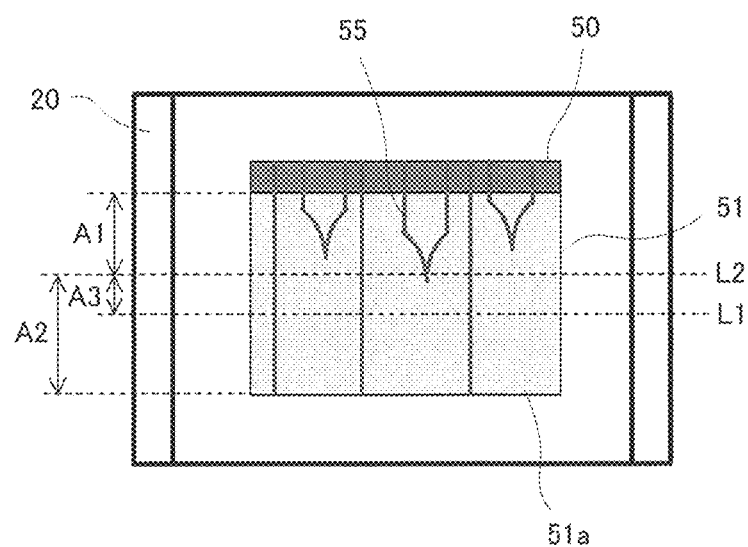

Such threading dislocations are shown schematically in FIG. 2A, FIG. 2B. FIG. 2A is a schematic illustration of the longitudinal section of the silicon carbide single crystal 51 at a point in time when the first step is completed. In connection with threading dislocations 55, a region where there are none or very few of the threading dislocations 55 (hereinafter, a low-defect region) is present beside the leading end of the silicon carbide single crystal 51. In detail, there are a first region, a1, where relatively many threading defects exist, and a second region, a2, where the threading dislocations 55 are relatively few, or none.

In FIG. 2A, a boundary line L1 between the first region a1 and the second region a2 is located at the leading end of the threading dislocation 55 extending farthest in the first region a1.

The type of the threading dislocation is defined by the direction of displacement of the crystal (Burgers vector). In connection with the threading screw dislocation, for example, the right-handed one (plus c) and the left-handed one (minus c) are known to exist.

The direction of a stress field acting around the dislocation is also different according to the type of the dislocation. The stress fields acting on the above-mentioned right-handed and left-handed threading screw dislocations are in directions opposite to each other, and attraction works between the threading screw dislocations (plus c and minus c) whose directions are opposite. Upon this attraction, the threading dislocations are considered to attract each other, resulting in pair annihilation.

The same mechanism applies to the threading edge dislocation as well, and synthesis of the dislocations occurs. The results of experiments demonstrate that the synthesis occurs mainly during crystal growth. On the other hand, the energy per se of the dislocation is known to depend on the length of the dislocation.

That is, the dislocation that has a long dislocation line has so high an energy as to exert a force for shortening the dislocation. The threading dislocation 55 in FIGS. 2A, 2B, showing the pair annihilation of the dislocations, will gain an advantage in energy, if it moves in a direction where its half-loop shortens.

If the dislocation is in a high temperature state in which it can move, its dislocation loop shortens. In FIG. 2A, therefore, it is conceivable for the half-loop to move in a direction in which it ascends and shortens. If the dislocation half-loop shown in the drawings is taken as an example, the point of the boundary line L1 in FIG. 2A ascends to the point of a boundary line L2 in FIG. 2B, with the result that the length of the first region a1 decreases to the length of a first region A1 in FIG. 2B.

The present invention utilizes a mechanism by which the crystal is maintained in a high temperature state making dislocation movement possible, whereupon the half-loop shrinks, with the two dislocations undergoing pair annihilation.

In the second regions a2, A2, which are low-defect regions, the density of the threading dislocations is equal to or less than a half of that in the first regions a1, A1.

The second step to be performed after the first step in the present invention maintains conditions under which the supply of the raw material gas is decreased so that the growth rate of the silicon carbide single crystal 51, or the etching rate, will be 0.1 mm/h or less. Owing to such a second step, the leading ends of the threading dislocations formed in the silicon carbide single crystal 51 grown in the first step are brought close to the surface of the seed substrate.

The gas partial pressures in the second step are not particularly limited, if they satisfy the conditions under which the growth rate of the silicon carbide single crystal 51, or the etching rate, will be 0.1 mm/h or less. Desirably, for example, the partial pressure of the $SiH_4$ gas is 2.0 kPa or higher, and the partial pressure of the $C_3H_8$ gas is 0.5 kPa or higher.

The duration of the second step is not particularly limited, and may be set as appropriate, because the longer the duration is, the more backward position the leading end of the threading dislocation 55 comes to. The desirable duration is, for example, 0.5 to 4 hours, preferably 2 to 3 hours.

FIG. 2B schematically shows a longitudinal sectional view of the silicon carbide single crystal 51 after the second step. In the drawing, the leading ends of the threading dislocations 55 in the first region A1 are farther apart from the growth surface 51a, and retreat toward the seed substrate. Hence, the boundary line L2 retreats from the boundary line L1, and the second region a2 expands by the size of a region A3, becoming the second region A2.

By executing the above-described first step and second step, the silicon carbide single crystal 51 having very few of the threading dislocations 55 can be manufactured. If a silicon carbide single crystal wafer is cut from the second region A2, the resulting silicon carbide single crystal wafer can be extremely decreased in the number of the threading dislocations.

The second region A2 after the second step can be used not only for cutting a silicon carbide single crystal wafer therefrom, but can also be used as a seed substrate. If the foregoing first step and second step are performed using such a seed substrate, a silicon carbide single crystal with much fewer threading dislocations can be manufactured, and the second regions a2, A2 in this case can be expanded further.

Other Embodiments

In the embodiment described above, the second step is executed within the reaction vessel 20 where the first step has been performed. However, the second step may be performed in a different vessel.

INDUSTRIAL APPLICABILITY

The present invention is available in the field of industry where a silicon carbide single crystal is manufactured.

EXPLANATIONS OF LETTERS OR NUMERALS

I Manufacturing apparatus
1 Raw material gas supply device
10 Vacuum container
11 First heat insulating material
12 Second heat insulating material
13 Exhaust path
15 Susceptor
20 Reaction vessel
30 Coil
50 Seed substrate
51 Silicon carbide single crystal
55 Threading dislocation

What is claimed is:
1. A silicon carbide single crystal ingot comprising:
a silicon carbide single crystal grown on a surface of a seed substrate,
wherein, at a site of pair annihilation of threading dislocations, or at a site of the silicon carbide single crystal on a side of a growth surface opposite to the seed substrate with respect to a site of synthesis of the threading dislocations, there is a low-defect site which is the site of pair annihilation, or in which the site of synthesis has disappeared, and
a density of the threading dislocations at the low-defect site is not more than a half of a density of the threading dislocations at a site beside the seed substrate with respect to the low-defect site.

* * * * *